United States Patent
Yeo et al.

(10) Patent No.: US 10,014,494 B2
(45) Date of Patent: Jul. 3, 2018

(54) METHOD OF DETACHING DISPLAY MODULE AND METHOD OF MANUFACTURING DISPLAY MODULE

(71) Applicant: SAMSUNG DISPLAY CO., LTD., Yongin-si, Gyeonggi-Do (KR)

(72) Inventors: Gilhwan Yeo, Suwon-si (KR); Min-woo Lee, Seoul (KR); Seungjun Moon, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/704,150

(22) Filed: Sep. 14, 2017

(65) Prior Publication Data

US 2018/0108876 A1  Apr. 19, 2018

(30) Foreign Application Priority Data

Oct. 19, 2016  (KR) ........................ 10-2016-0136013

(51) Int. Cl.
*H01L 21/673* (2006.01)
*H01L 51/56* (2006.01)
*H01L 51/00* (2006.01)

(52) U.S. Cl.
CPC ............ *H01L 51/56* (2013.01); *H01L 21/673* (2013.01); *H01L 51/003* (2013.01); *H01L 2227/326* (2013.01)

(58) Field of Classification Search
CPC ..... H01L 51/56; H01L 51/003; H01L 21/673; H01L 2227/326
See application file for complete search history.

(56) References Cited

U.S. PATENT DOCUMENTS

| | | | |
|---|---|---|---|
| 6,843,879 B1 | 1/2005 | Huang et al. | |
| 8,376,017 B2 | 2/2013 | Lee et al. | |
| 9,257,679 B2 | 2/2016 | Lee et al. | |
| 9,308,697 B2 | 4/2016 | Ke et al. | |
| 2009/0004772 A1* | 1/2009 | Jinbo | H01L 27/1214 438/99 |
| 2015/0123106 A1 | 5/2015 | Yasumoto et al. | |

FOREIGN PATENT DOCUMENTS

| | | |
|---|---|---|
| JP | 2014-082409 | 5/2014 |
| KR | 10-2015-0077854 | 7/2015 |
| KR | 10-2016-0079669 | 7/2016 |

OTHER PUBLICATIONS

Ke et al., "Advantages of Coat-Debond Technology for Flexible Display", SID 2016 Digest, pp. 1495-1497.

* cited by examiner

*Primary Examiner* — Kyoung Lee
(74) *Attorney, Agent, or Firm* — F. Chau & Associates, LLC

(57) ABSTRACT

Provided is a method of detaching a display module. The method of detaching the display module includes providing a carrier substrate, forming a display module, which is divided into a first area and a second area, on the carrier substrate, disposing a protective film covering the first area and exposing the second area on the display module, performing a first detaching process of detaching the second area from the carrier substrate by using a first detaching unit, and performing a second detaching process of detaching the protective film and the display module from the carrier substrate by using a second detaching unit.

20 Claims, 10 Drawing Sheets

METHOD OF DETACHING DISPLAY MODULE AND METHOD OF MANUFACTURING DISPLAY MODULE

CROSS-REFERENCE TO RELATED APPLICATIONS

This U.S. non-provisional patent application claims priority under 35 U.S.C. § 119 of Korean Patent Application No. 10-2016-0136013, filed on Oct. 19, 2016, the entire contents of which are hereby incorporated by reference.

BACKGROUND

The present disclosure herein relates to a method of detaching a display module and a method of manufacturing the display module, and more particularly, to a method of detaching a display module, in which detachment defects are reduced, and a method of manufacturing the display module.

In a process of manufacturing a display device including a display module, the display module may be covered by using a protective film for protecting the display module against external environments. The protective film may protect the display module during a predetermined process and then be removed from the display module in the final product.

SUMMARY

The present disclosure provides a method of detaching a display module, in which defects occurring when the display module is detached from a carrier substrate are reduced, and a method of manufacturing the display module.

An embodiment of the inventive concept provides a method of detaching a display module includes: providing a carrier substrate; forming a display module, which is divided into a first area and a second area, on the carrier substrate; disposing a protective film covering the first area and exposing the second area on the display module; performing a first detaching process of detaching the second area from the carrier substrate by using a first detaching unit; and performing a second detaching process of detaching the protective film and the display module from the carrier substrate by using a second detaching unit.

In an embodiment, the second detaching process may be performed after the first detaching process is performed.

In an embodiment, in the first detaching process, the first detaching unit may come into direct contact with the display module to detach the second area of the display module from the carrier substrate, and in the second detaching process, the second detaching unit may come into direct contact with the protective film to detach the display module and the protective film from the carrier substrate.

In an embodiment, a boundary between the first area and the second area may extend in a first direction, and in the first detaching process, the second area extending in the first direction may be detached from the carrier substrate.

In an embodiment, the display module may have a plurality of vertexes, and in the disposing of the protective film, the protective film may be disposed so that the protective film does not cover only one vertex of the plurality of vertexes.

In an embodiment, in the first detaching process, the first detaching unit may detach the one vertex from the carrier substrate.

In an embodiment, the method may further include: inserting a cutting member between the second area of the display module and the carrier substrate before the second detaching process; and moving the cutting member in a first direction.

In an embodiment, the first detaching unit may include a first absorption pad, and the second detaching unit may include a second absorption pad, and the first detaching process may be performed by the first absorption pad, and the second detaching process is performed by the second absorption pad.

In an embodiment, absorption force of the first absorption pad in the first detaching process may be greater than that of the second absorption pad in the second detaching process.

In an embodiment, the first absorption pad may comprise a plurality of first absorption pads, and the second area may be detached from the carrier substrate by the plurality of first absorption pads.

In an embodiment, the first detaching unit may include a support and an adhesive tape wound around the support, and in the first detaching process, the second area may adhere to the adhesive tape and be detached from the carrier substrate.

In an embodiment, the second detaching unit may include a plurality of absorption pads, and in the second detaching process, the plurality of absorption pads may move at the same time in a direction that is away from the carrier substrate to detach the protective film and the display module from the carrier substrate.

In an embodiment, the second detaching unit may include a plurality of absorption pads, and in the second detaching process, the protective film and the display module may be detached from the carrier substrate in order from the absorption pads, which are adjacent to the first detaching unit, of the plurality of absorption pads.

In an embodiment, the forming of the display module may include: providing a base layer on the carrier substrate; forming a circuit layer on the base layer; and forming a light emitting device layer on the circuit layer, wherein all the base layer, the circuit layer, and the light emitting device layer may be disposed within the first area, and the base layer is disposed within the second area.

In an embodiment, the method may further include forming a sacrificial layer on the carrier substrate before the forming of the display module.

In an embodiment of the inventive concept, a method of manufacturing a display module includes: providing a carrier substrate; forming a base layer including an effective area and a dummy area on the carrier substrate; forming a circuit layer on the effective area; forming a light emitting device layer on the circuit layer; forming an encapsulation layer covering the light emitting device layer and the circuit layer on the light emitting device layer; disposing a protective film covering the effective area and exposing at least a portion of the dummy area on the encapsulation layer; performing a detaching process of detaching the base layer, the circuit layer, the light emitting device layer, the encapsulation layer, and the protective film from the carrier substrate; and cutting a boundary between the dummy area and the effective area to remove the dummy area.

In an embodiment, the detaching process may include: performing a first detaching process of detaching the at least portion of the dummy area of the base layer, which is exposed by the protective film, from the carrier substrate; and performing a second detaching process of detaching the base layer covered by the protective film from the carrier substrate after the first detaching process.

In an embodiment, the detaching process may further include performing an intermediate detaching process of detaching the other portion of the dummy area, which is not detached from the carrier substrate before the second detaching process, from the carrier substrate after the first detaching process.

In an embodiment, the method may further include forming a sacrificial layer on the carrier substrate before the forming of the base layer on the carrier substrate.

In an embodiment, the method may further include detaching the protective film from the base layer, the circuit layer, the light emitting device layer, and the encapsulation layer before the removing of the dummy area.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
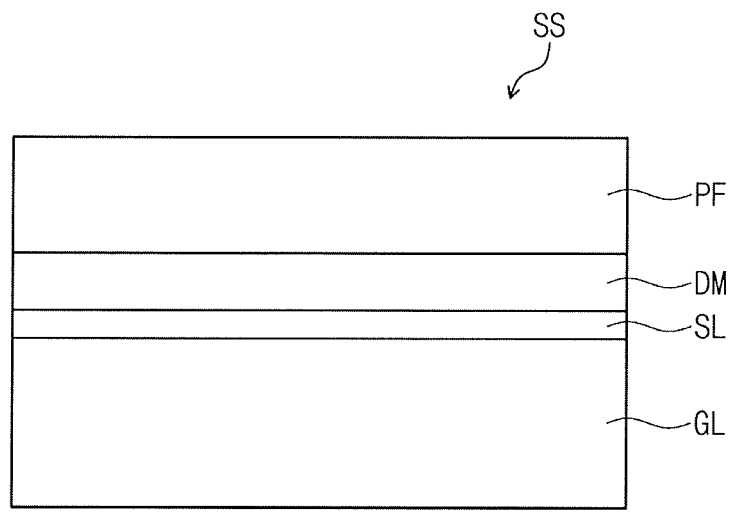
FIG. 1 is a schematic cross-sectional view of a stacked substrate.

Since the present disclosure may have diverse modified embodiments, specific embodiments are illustrated in the drawings and are described in the detailed description of the inventive concept. However, this does not limit the present disclosure within specific embodiments and it should be understood that the present disclosure covers all the modifications, equivalents, and replacements within the idea and technical scope of the inventive concept.

In this specification, it will also be understood that when one component (or region, layer, portion) is referred to as being 'on', 'connected to', or 'coupled to' another component, it can be directly connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

FIG. 1 is a schematic cross-sectional view of a stacked substrate.

Referring to FIG. 1, a stacked substrate SS may include a carrier substrate GL, a sacrificial layer SL, a display module DM, and a protective film PF. The display module DM may include a display panel for displaying an image and an input sensing unit for sensing an external input. Also, the display module DM may include only the display panel. The sacrificial layer SL may be disposed on the carrier substrate GL, the display module DM may be disposed on the sacrificial layer SL, and the protection module PF may be disposed on the display module DM. The protective film PF may extend to be coupled to the carrier substrate GL.

The carrier substrate GL may be a substrate that moves along a process line constituting the display module DM in the process of manufacturing the display module DM. The carrier substrate GL may have a relatively rigid property and an insulation property. For example, the carrier substrate GL may include glass.

The sacrificial layer SL may be deposited or applied on the carrier substrate GL. The sacrificial layer SL may reduce adhesion force between the carrier substrate GL and the display module DM. The sacrificial layer SL may include at least one of a metal, a metal oxide, silicon oxide, silicon nitride, nano particles, or an organic material. However, the embodiment of the inventive concept is not limited to the material of the sacrificial layer SL. For example, the sacrificial layer SL may include a material that reduces the adhesion force between the carrier substrate GL and the display module DM.

The display module DM may be a flexible display module DM. The display module DM will be described below in more detail with reference to FIG. 3.

The protection layer PF may be disposed on the display module DM. The protective film PF may protect the display module DM against external environments. The protective film PF may include a plastic film including one selected from the group consisting of polyethersulphone (PES), polyacrylate (PAR), polyetherimide (PEI), polyethyelenennaphthalate (PEN), polyethyeleneterepthalate(PET), polyphenylene sulfide (PPS), polyallylate, polyimide (PI), polycarbonate (PC), poly(arylene ethersulfone), and a combination thereof.

Figure 2:
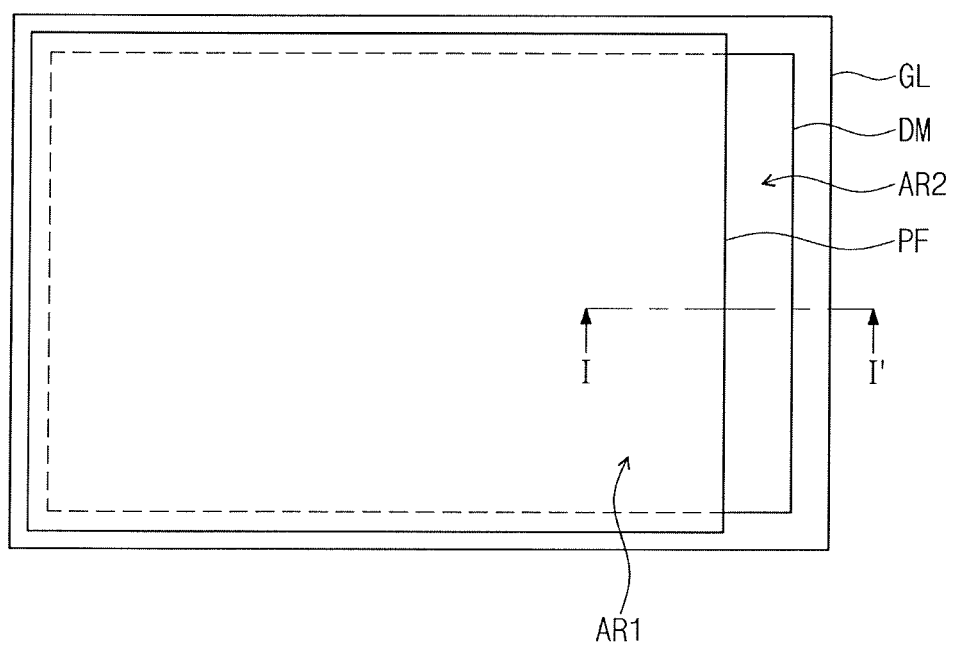
FIG. 2 is a plan view of the stacked substrate of FIG. 1.
Figure 3:
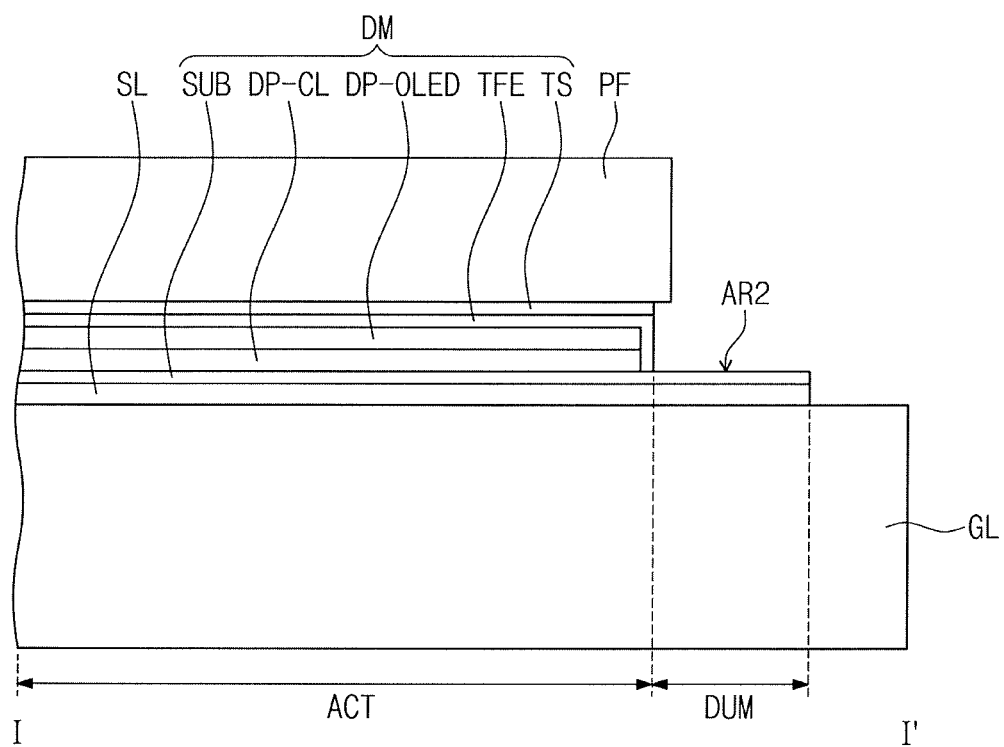
FIG. 3 is a cross-sectional view taken along line I-I' of FIG. 2.

FIG. 2 is a plan view of the stacked substrate of FIG. 1, and FIG. 3 is a cross-sectional view taken along line I-I' of FIG. 2.

Referring to FIGS. 2 and 3, the display module DM may include a base layer SUB, a circuit layer DP-CL, a light emitting device layer DP-OLED, an encapsulation layer TFE, and a input sensing circuit TS. Although an organic light emitting display module is representatively described as an example of the display module DM, the embodiment of the inventive concept is not limited thereto.

The base layer SUB may be disposed on the sacrificial layer SL. The base layer SUB may include at least one plastic film. The base layer SUB may include a plastic substrate, a glass substrate, a metal substrate, or an organic/inorganic composite substrate as a flexible substrate. The plastic substrate may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

A base layer SUB may include an effective area ACT and a dummy area DUM. The dummy area DUM may be an area that is removed from the final product. An alignment pattern for alignment may be disposed on the dummy area DUM.

The circuit layer DP-CL may be disposed on the base layer SUB. Particularly, the circuit layer DP-CL may be disposed on the effective area ACT of the base layer SUB. The circuit layer DP-CL may include a plurality of insulation layers, a plurality of conductive layers, and a semiconductor layer. The plurality of conductive layers of the circuit layer DP-CL may constitute signal lines or a control circuit of a pixel.

The light emitting device layer DP-OLED may be disposed on the circuit layer DP-CL. The light emitting device layer DP-OLED may include organic light emitting diodes.

The encapsulation layer TFE may be disposed on the light emitting device layer DP-OLED. The encapsulation layer TFE may seal the light emitting device layer DP-OLED. The encapsulation layer TFE may include a plurality of inorganic thin films and at least one organic thin film disposed between the inorganic thin films. The inorganic thin films may protect the light emitting device layer DP-OLED against moisture and oxygen, and the organic thin film may protect the light emitting device layer DP-OLED against foreign substances such as dust particles.

The input sensing circuit TS includes touch sensors and touch signal lines. The touch sensors and the touch signal lines may have a single layer structure or a multilayered structure. Each of the touch sensors and the touch signal lines may include indium tin oxide (ITO), indium zinc oxide (IZO), zinc oxide (ZnO), or indium tin zinc oxide (ITZO), PEDOT, a metal nano wire, or graphene. Each of the touch sensors and the touch signal lines and the sensors may include a metal layer, for example, molybdenum, silver, titanium, copper, aluminum, or an alloy thereof. The touch sensors and the touch signal lines may have the same layer structure or layer structures different from each other.

The input sensing circuit TS may be directly disposed on the encapsulation layer TFE. In this specification, the term "directly disposed" means that a component is formed through the continuous process except that the component adheres by using a separate adhesion layer. However, the embodiment of the inventive concept is not limited thereto. For example, the input sensing circuit TS may be attached to the encapsulation layer TFE after being disposed on a film or a substrate.

The protection layer PF may be disposed on the display module DM. The protective film PF may cover the effective area ACT and expose a portion of the dummy area DUM. The display module DM may be divided into a first area AR1 covered by the protective film PF and a second area AR2 that is not covered by the protective film PF. The second area AR2 and the dummy area DUM may completely match each other, or the dummy area DUM may be greater than the second area AR2.

FIGS. 4A to 4I are views illustrating a method of manufacturing the display module according to an embodiment of the inventive concept. Particularly, FIGS. 4E to 4H are cross-sectional views illustrating a method of detaching the display module according to an embodiment of the inventive concept.

Figure 4A:
FIGS. 4A to 4I are views illustrating a method of detaching a display module and a method of manufacturing the display module according to an embodiment of the inventive concept.
Figure 4B:
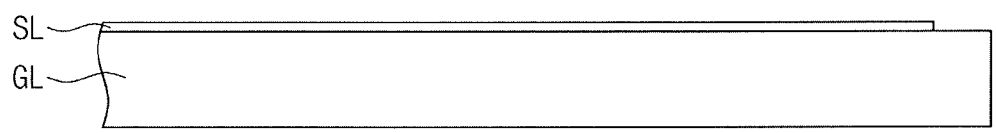

Referring to FIGS. 4A and 4B, after a carrier substrate GL is provided, a sacrificial layer SL is formed on the carrier substrate GL. The sacrificial layer SL may be formed through a coating or deposition process, but is not limited thereto.

Figure 4C:
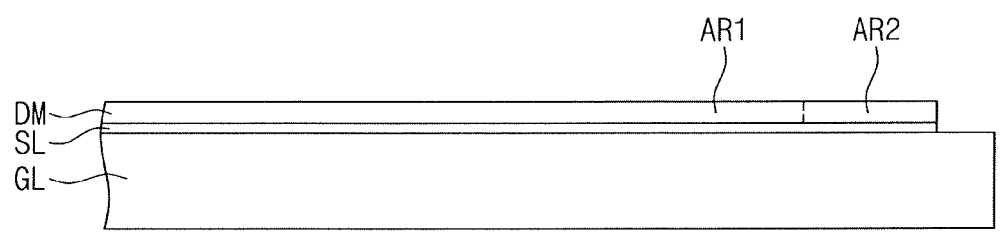

Referring to FIG. 4C, a display module DM is formed on the sacrificial layer SL. A process of forming the display module DM will be described in detail with reference to FIG. 3. Referring to FIGS. 3 and 4, a base layer SUB is formed on the sacrificial layer SL. The base layer SUB may include a material having flexibility. A circuit layer DP-CL is formed on the base layer SUB. The circuit layer DP-CL may be formed through a plurality of mask processes. The circuit layer DP-CL may include a plurality of insulation layers, a semiconductor layer, and a plurality of conductive layers. A light emitting device layer DP-OLED is formed on the circuit layer DP-CL. An encapsulation layer TFE covering the circuit layer DP-CL and the light emitting device layer DP-OLED is formed on the light emitting device layer DP-OLED.

The circuit layer DP-CL, the light emitting device layer DP-OLED, and the encapsulation layer TFE may be formed on an effective area ACT of the base layer SUB, but may not formed on a dummy area DUM. However, the embodiment of the inventive concept is not limited thereto. For example, the encapsulation layer TFE may be formed on the dummy area DUM. However, the encapsulation layer TFE formed on the dummy area DUM may be removed together with the dummy area DUM of the base layer SUB in a post process.

Figure 4D:
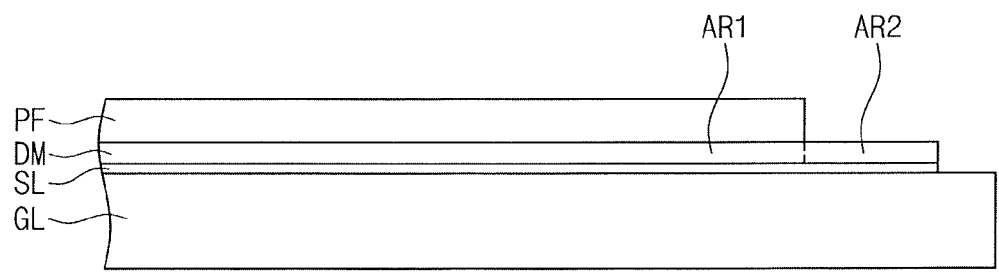

Referring to FIG. 4D, the protective film PF may be disposed on the encapsulation layer TFE. The protective film PF may surround the display module and be coupled to the carrier substrate GL. The protective film PF may expose a portion of the display module DM and cover the display module DM.

FIGS. 4E to 4H are cross-sectional views illustrating a process of detaching the protective film PF and the display module DM from the carrier substrate GL.

Figure 4E:
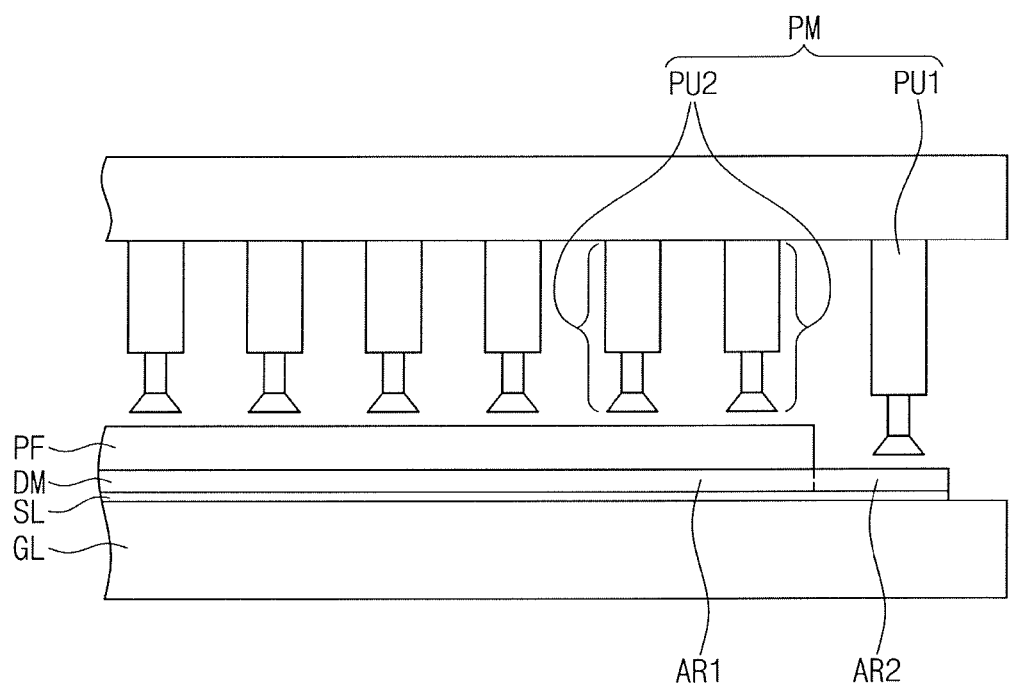

Referring to FIG. 4E, a detaching device PM is provided on the protective film PF. The detaching device PM may include a first detaching unit PU1 and a second detaching unit PU2. The first detaching unit PU1 may detach the second area AR2 of the display module DM from the carrier substrate GL, and the second detaching unit PU2 may detach the first area AR1 of the display module DM from the carrier substrate GL.

The first detaching unit PU1 may include at least one first absorption pad, and second detaching unit PU2 may include at least one second absorption pad. The first and second absorption pads come into contact with an object to be absorbed to absorb the object in a vacuum state in which air between the first and second absorption pads and the object is removed.

Figure 4F:
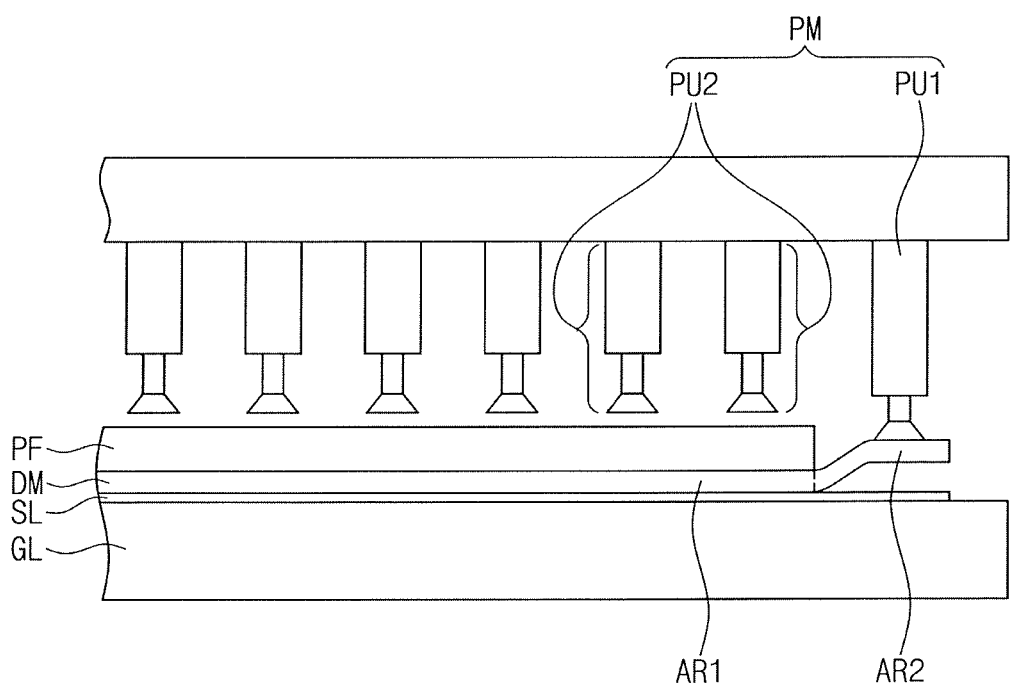

FIG. 4F is a view illustrating a first detaching process. In the first detaching process, the second area AR2 may be detached from the carrier substrate GL by using the first detaching unit PU1. Since the second area AR2 is not covered by the protective film PF, the first detaching unit PU1 may come into direct contact with the display module DM to detach the second area AR2 from the carrier substrate GL.

Figure 4G:
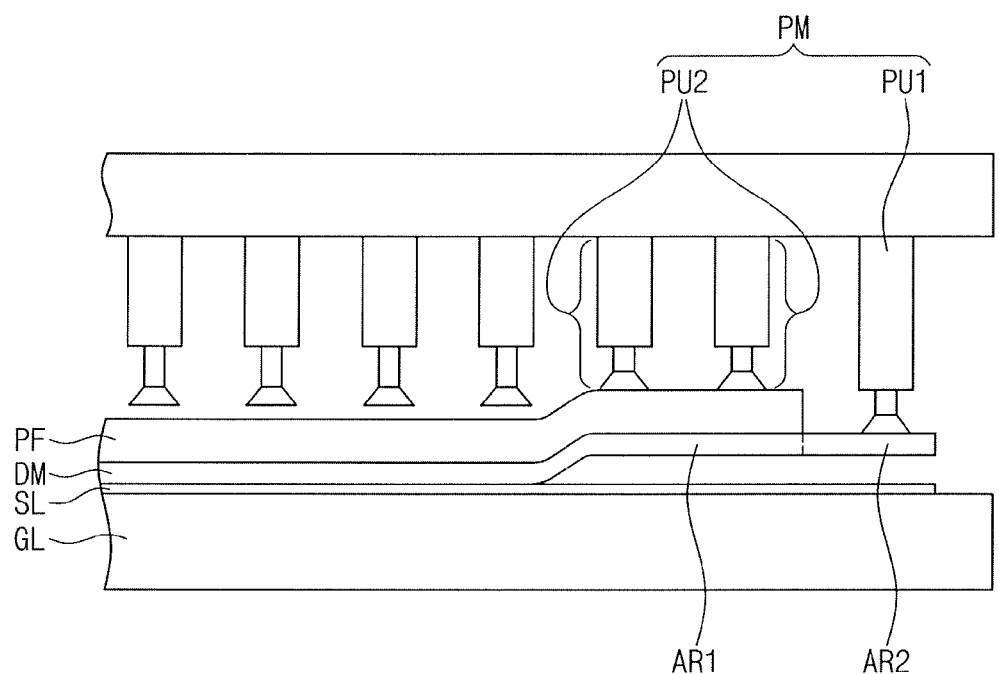

FIG. 4G is a view illustrating a second detaching process. In the second detaching process, the first area AR1 may be detached from the carrier substrate GL by using the second detaching unit PU2. Since the first area AR1 is covered by the protective film PF, the second detaching unit PU2 may not come into direct contact with the display module DM. In this case, the second detaching unit PU2 may come into direct contact with the protective film PF to detach the display module DM and the protective film PF from the carrier substrate GL. The plurality of second absorption pads of the second detaching unit PU2 may detach the protective film PF and the display module DM from the carrier substrate GL in order from the second absorption pads adjacent to the first detaching unit PU1.

Adhesion force between the display module DM and the carrier substrate GL in an initial detaching process of the detaching process is different from that between the display module DM and the carrier substrate GL in an ongoing detaching process of the detaching process. For example, the adhesion force between the display module DM and the carrier substrate GL in the initial detaching process may be greater than that between the display module DM and the carrier substrate GL in the ongoing detaching process. Thus, absorption force of the first absorption pads may be greater than that of the second absorption pads.

Unlike an embodiment of the inventive concept, when the protective film PF cover the entire display module DM, and the display module DM is detached from the carrier substrate GL, although adhesion force between the protective film PF and the display module DM is greater than that between the display module DM and the carrier substrate GL, detachment defects in which the protective film PF is detached from the display module DM may occur in the initial detaching process. However, according to an embodiment of the inventive concept, the protective film PF does not cover a portion of the display module DM. That is, the exposed portion of the display module DM may be detached first from the carrier substrate GL by using the first detaching unit PU1, and then, the protective film PF and the display module DM may be detached from the carrier substrate GL by using the second detaching unit PU2. In this case, the detachment defects in which the protective film PF is detached from the display module DM in the initial detaching process may be reduced.

Figure 4H:
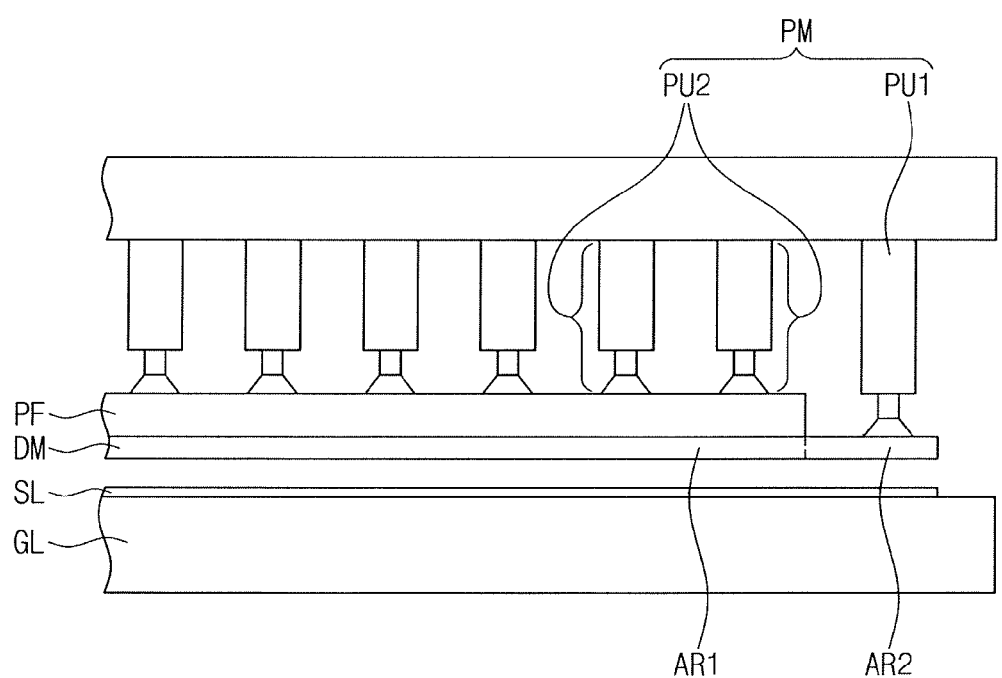

FIG. 4H is a cross-sectional view illustrating a state in which the protective film PF and the display module DM are completely detached from the carrier substrate GL. A portion of a material forming the sacrificial layer SL may remain on one surface of the display module DM that has come into contact with the sacrificial layer SL.

Figure 4I:
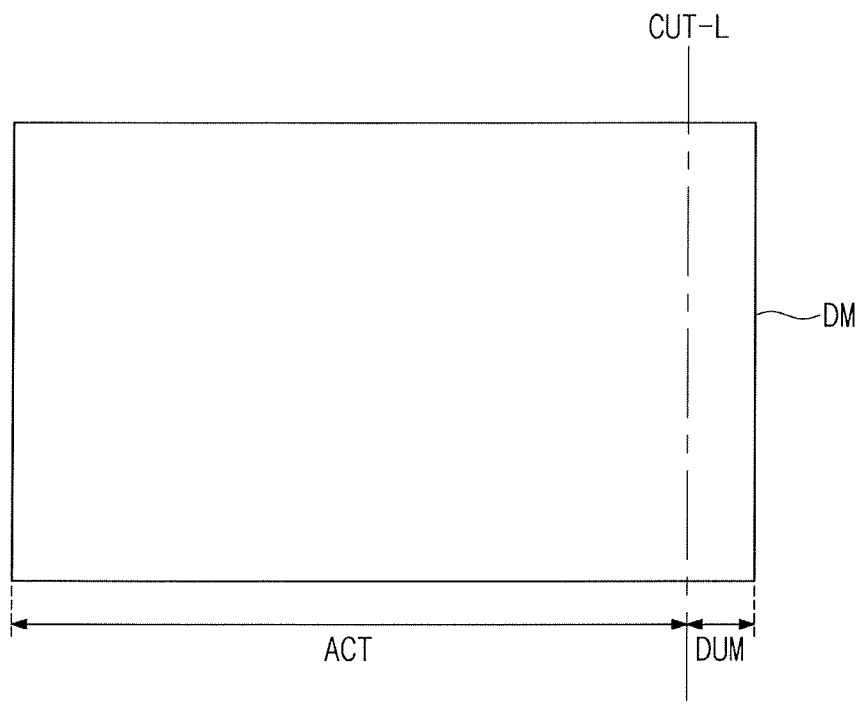

FIG. 4I is a view illustrating a process of cutting a boundary CUT-L between the dummy area DUM and the effective area ACT. The area on which the first detaching unit PU1 comes into direct contact with the display module DM without being covered by the protective film PF may be a portion of the dummy area DUM. Thus, although the portion of the dummy area DUM is not covered by the protective film PF and comes into direct contact with the first detaching unit PU1 to cause scratches, since the dummy area DUM is cut and removed, the dummy area DUM may not have an influence on reliability of the final product.

Figure 5A:
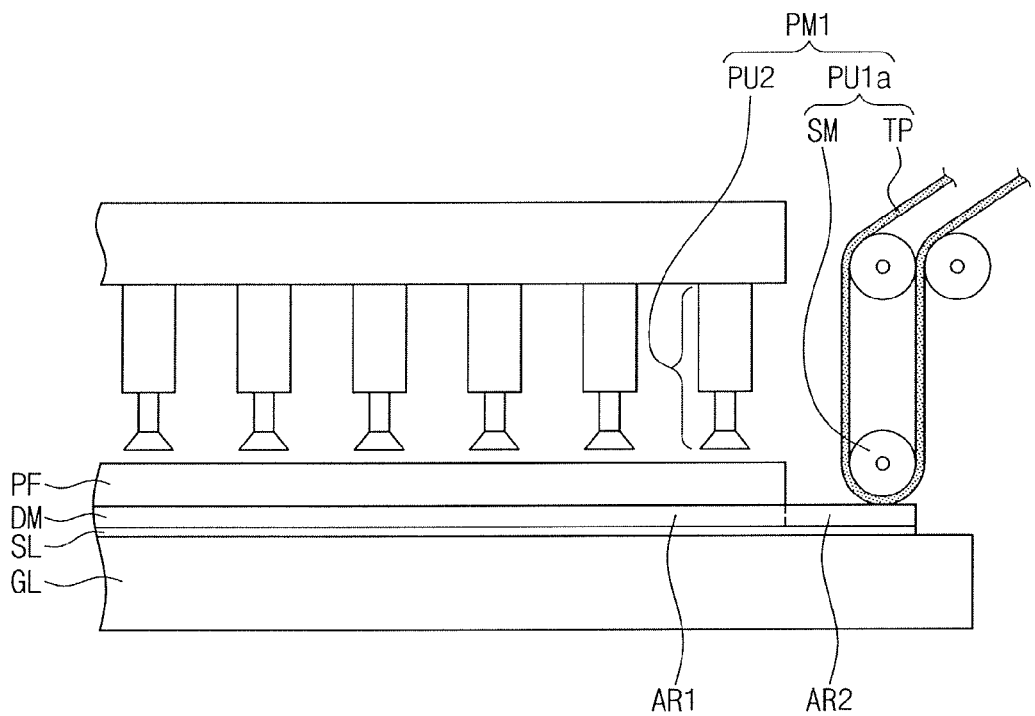
FIGS. 5A and 5B are cross-sectional views for explaining a first detaching process according to an embodiment of the inventive concept.
Figure 5B:
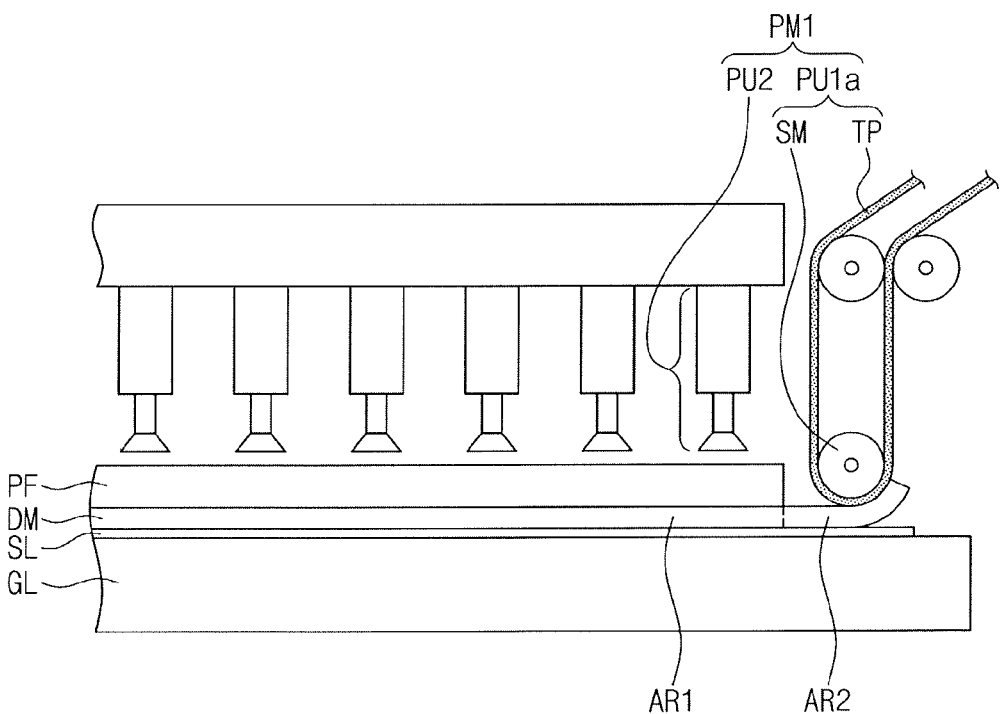

FIGS. 5A and 5B are cross-sectional views illustrating a first detaching process according to another embodiment of the inventive concept.

Referring to FIGS. 5A and 5B, a detaching device PM1 is provided on a protective film PF. The detaching device PM1 may include a first detaching unit PU1a and a second detaching unit PU2.

The first detaching unit PU1a may include a support SM and an adhesive tape TP wound around the support SM. Although the support SM has a circular cross-section in FIGS. 5A and 5B, the embodiment of the inventive concept is not limited thereto. For example, the support SM may have a polygonal cross-section. The second detaching unit PU2 may include absorption pads.

In the first detaching process, a second area AR2 may be attached to the adhesive tape TP and thus detached from a carrier substrate GL. After a second area AR2 is detached, a first area AR1 of a display module DM may be detached from the carrier substrate GL by using the second detaching unit PU2.

Figure 5C:
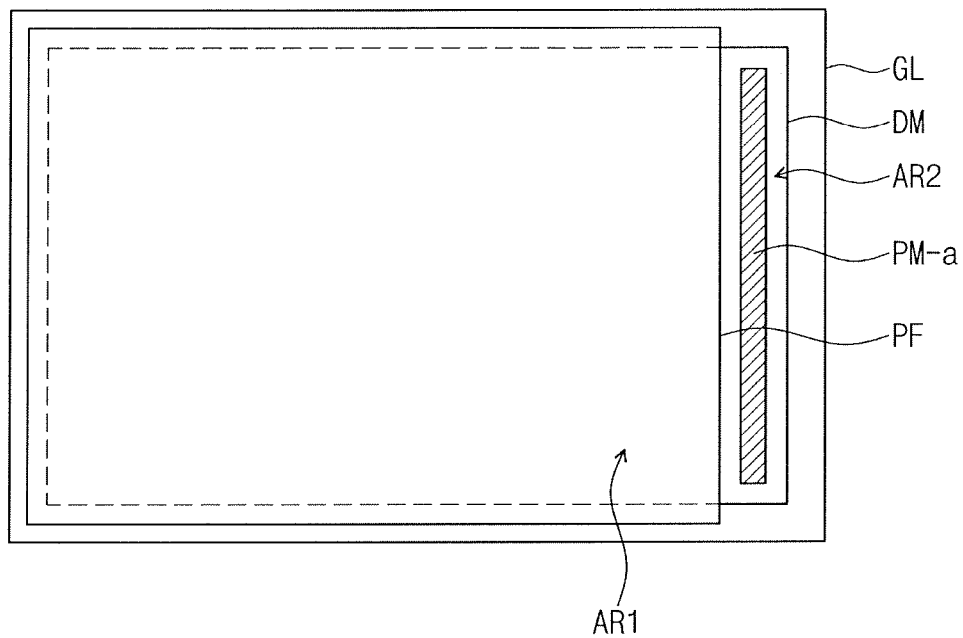
FIG. 5C is a plan view illustrating an example of a position coming into contact with a first detaching unit in the first detaching process.

FIG. 5C is a plan view illustrating an example of a position coming into contact with the first detaching unit in the first detaching process.

Referring to FIGS. 5B and 5C, the first detaching unit PU1a may include one support SM and an adhesive tape TP wound around the support SM. The adhesive tape TP may be attached to a contact area PM-a of the display module DM of FIG. 5C to detach the second area AR2 of the display module DM from the carrier substrate GL.

Figure 5D:
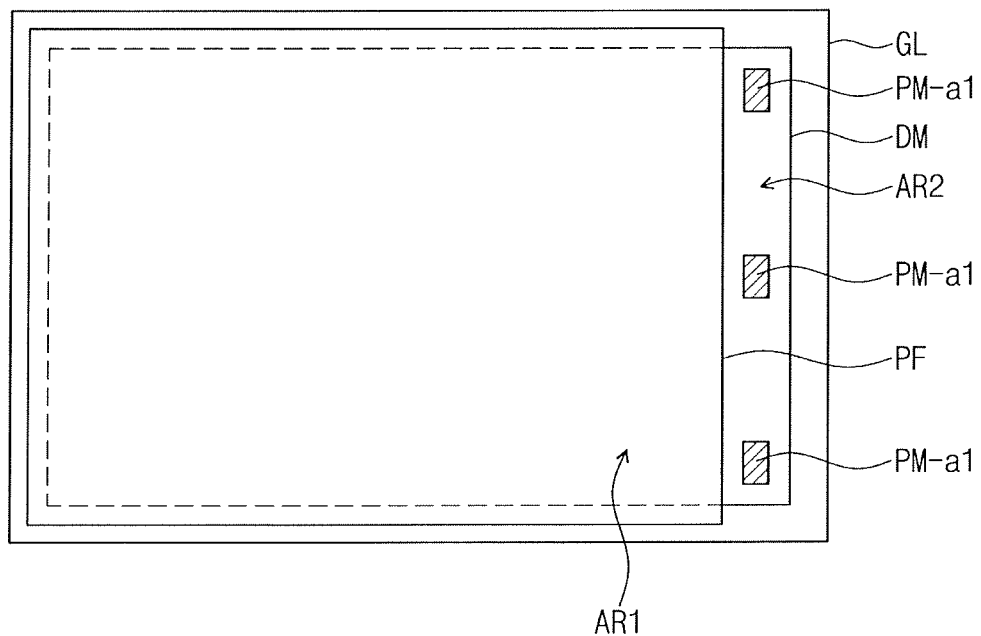
FIG. 5D is a plan view illustrating another example of the position coming into contact with the first detaching unit in the first detaching process.

FIG. 5D is a plan view illustrating another example of the position coming into contact with the first detachment unit in the first detachment process.

Referring to FIGS. 5B and 5D, the first detaching unit PU1a may include a plurality of supports SM and an adhesive tape TP wound around the plurality of supports SM. The plurality of supports SM may be disposed to be spaced a predetermined distance from each other, and the adhesion tape TP wound around the plurality of supports SM may be attached to contact areas PM-a1 of the display module of FIG. 5D to detach the second area AR2 of the display module DM from the carrier substrate GL.

Figure 6:
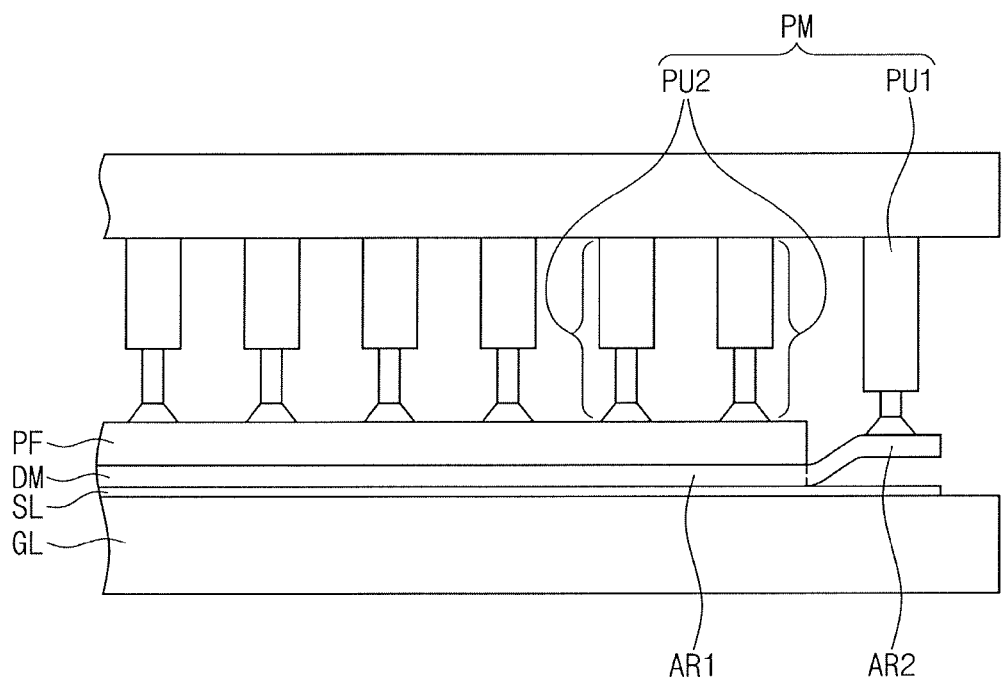
FIG. 6 is a cross-sectional view for explaining a second detaching process.

FIG. 6 is a cross-sectional view for explaining a second detaching process.

When comparing FIG. 6 to FIG. 4G, there is a difference in method of detaching the first area AR1. In FIG. 4G, the plurality of absorption pads of the second detaching unit PU2 may detach the protective film PF and the display module DM from the carrier substrate GL in order from the absorption pads adjacent to the first detecting unit PU1. However, in case of FIG. 6, the plurality of absorption pads of the second detaching unit PU2 may move at the same time in a direction that is away from the carrier substrate GL. Thus, after the first detaching process, the protective film PF and the display module DM may be detached from the carrier substrate GL at the same time.

Figure 7:
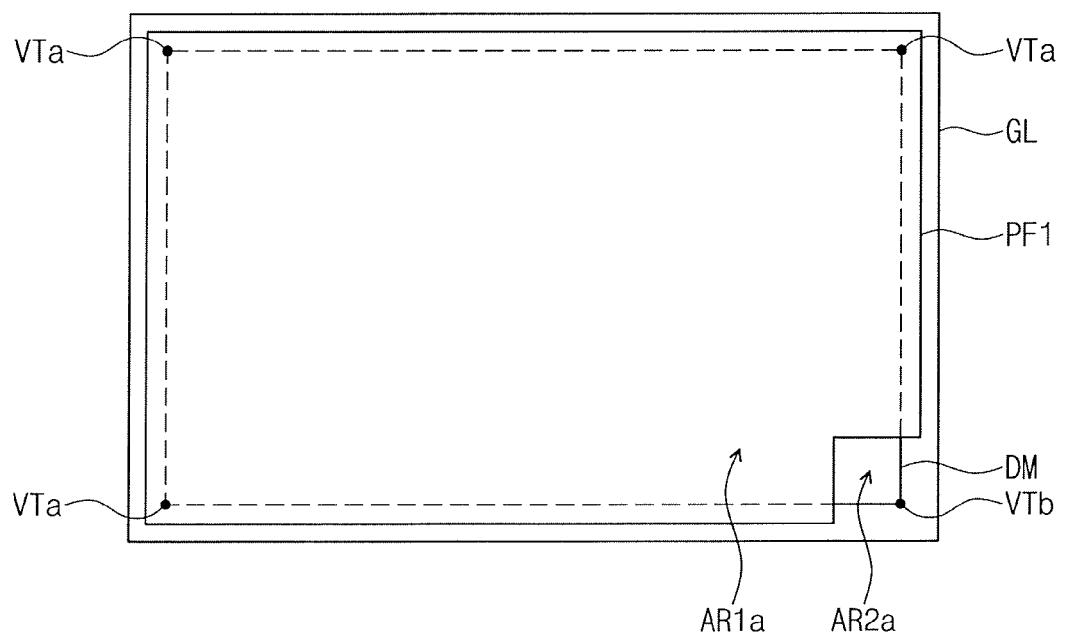
FIG. 7 is a plan view of the stacked surface of FIG. 1.

FIG. 7 is a plan view of the stacked surface of FIG. 1.

Referring to FIG. 7, the display module DM may have a plurality of vertexes VTa and VTb. In FIG. 7, the display module DM may have a rectangular shape and include four vertexes VTa and VTb.

In this embodiment, the protective film PFI may cover three vertexes VTa of the four vertexes VTa and VTb and may not cover one vertex VTb. That is, when compared to FIG. 2, an area that is not covered by the protective film PF1 may be less than that of FIG. 7.

Figure 8:
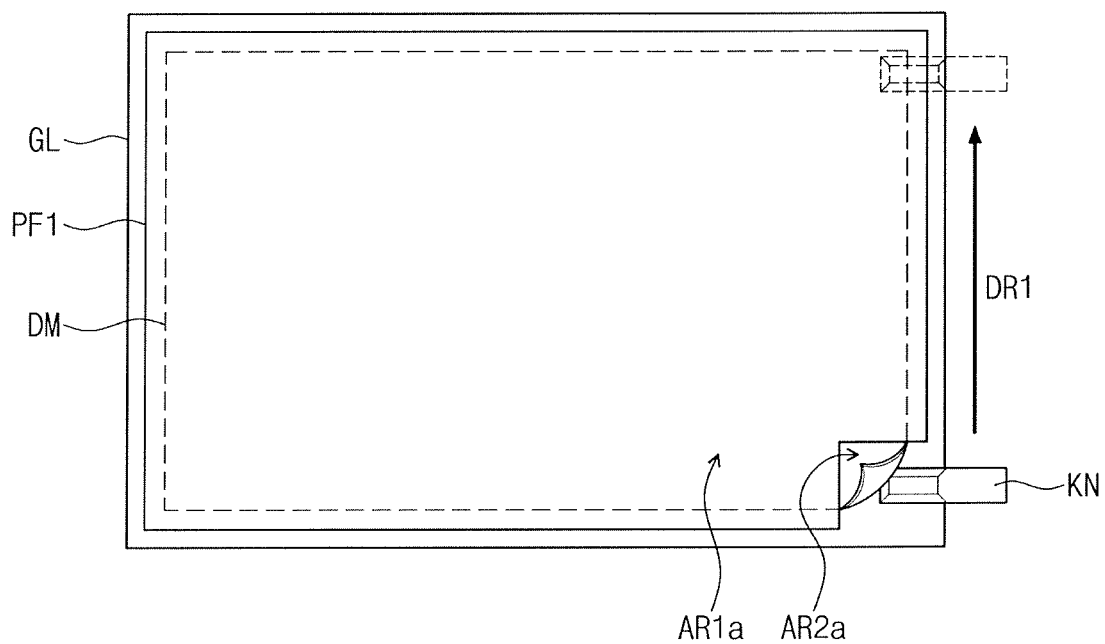
FIG. 8 is a view for explaining a portion of the process of detaching the display module and a protective film from a carrier substrate.

FIG. 8 is a view for explaining a portion of the process of detaching the display module and a protective film from the carrier substrate.

A process described with reference to FIG. 8 may be an intermediate detaching process that is performed before a second detaching process of detaching a first area AR1a after a first detaching process of detaching a second area AR2a.

After the second area AR2a is detached, a cutting member KN may be inserted between the second area AR2a of the display module DM and the carrier substrate GL. The cutting member KN may move in the first direction DR1. As a result, the second area AR2 of the display module DM and the carrier substrate GL may be detached from each other in the first direction DRI. Thereafter, the second detaching process of detaching the first area AR1a may be performed.

According to the embodiment of the inventive concept, in the process of detaching all the display module and the protective film from the carrier substrate, the display module disposed between the protective film and the carrier substrate may be partially exposed. Thus, after the display module is detached first, all the display module and the protective film may be detached from the carrier substrate. Therefore, the phenomenon in which the display module and the protective film are separated from each other may be prevented to reduce the defects while the display module is detached from the carrier substrate.

It will be apparent to those skilled in the art that various modifications and variations can be made in the inventive concept. Thus, it is intended that the present disclosure covers the modifications and variations of this invention provided they come within the scope of the appended claims and their equivalents. Hence, the real protective scope of the inventive concept shall be determined by the technical scope of the accompanying claims.

What is claimed is:

1. A method of detaching a display module, comprising:
providing a carrier substrate;
forming a display module, which is divided into a first area and a second area, on the carrier substrate;
disposing a protective film covering the first area and exposing the second area on the display module;
performing a first detaching process of detaching the second area from the carrier substrate by using a first detaching unit; and
performing a second detaching process of detaching the protective film and the display module from the carrier substrate by using a second detaching unit.

2. The method of claim 1, wherein the second detaching process is performed after the first detaching process is performed.

3. The method of claim 1, wherein, in the first detaching process, the first detaching unit comes into direct contact with the display module to detach the second area of the display module from the carrier substrate, and
in the second detaching process, the second detaching unit comes into direct contact with the protective film to detach the display module and the protective film from the carrier substrate.

4. The method of claim 1, wherein a boundary between the first area and the second area extends in a first direction, and
in the first detaching process, the second area extending in the first direction is detached from the carrier substrate.

5. The method of claim 1, wherein the display module has a plurality of vertexes, and
in the disposing of the protective film, the protective film is disposed so that the protective film does not cover only one vertex of the plurality of vertexes.

6. The method of claim 5, wherein, in the first detaching process, the first detaching unit detaches the one vertex from the carrier substrate.

7. The method of claim 6, further comprising:
inserting a cutting member between the second area of the display module and the carrier substrate before the second detaching process; and
moving the cutting member in a first direction.

8. The method of claim 1, wherein the first detaching unit comprises a first absorption pad, and the second detaching unit comprises a second absorption pad, and
the first detaching process is performed by the first absorption pad, and the second detaching process is performed by the second absorption pad.

9. The method of claim 8, wherein absorption force of the first absorption pad in the first detaching process is greater than that of the second absorption pad in the second detaching process.

10. The method of claim 8, wherein the first absorption pad comprises a plurality of first absorption pads, and the second area is detached from the carrier substrate by the plurality of first absorption pads.

11. The method of claim I, wherein the first detaching unit comprises a support and an adhesive tape wound around the support, and
in the first detaching process, the second area adheres to the adhesive tape and is detached from the carrier substrate.

12. The method of claim 1, wherein the second detaching unit comprises a plurality of absorption pads, and
in the second detaching process, the plurality of absorption pads move at the same time in a direction that is away from the carrier substrate to detach the protective film and the display module from the carrier substrate.

13. The method of claim 1, wherein the second detaching unit comprises a plurality of absorption pads, and
in the second detaching process, the protective film and the display module are detached from the carrier substrate in order from the absorption pads, which are adjacent to the first detaching unit, of the plurality of absorption pads.

14. The method of claim 1, wherein the forming of the display module comprises:
providing a base layer on the carrier substrate;
forming a circuit layer on the base layer; and
forming a light emitting device layer on the circuit layer, wherein all the base layer, the circuit layer, and the light emitting device layer are disposed within the first area, and the base layer is disposed within the second area.

15. The method of claim 1, further comprising forming a sacrificial layer on the carrier substrate before the forming of the display module.

16. A method of manufacturing a display module, comprising:
providing a carrier substrate;
forming a base layer comprising an effective area and a dummy area on the carrier substrate;
forming a circuit layer on the effective area;
forming a light emitting device layer on the circuit layer;
forming an encapsulation layer covering the light emitting device layer and the circuit layer on the light emitting device layer;
disposing a protective film covering the effective area and exposing at least a portion of the dummy area on the encapsulation layer;
performing a detaching process of detaching the base layer, the circuit layer, the light emitting device layer, the encapsulation layer, and the protective film from the carrier substrate; and cutting a boundary between the dummy area and the effective area to remove the dummy area.

17. The method of claim 16, wherein the detaching process comprises:
performing a first detaching process of detaching the at least a portion of the dummy area of the base layer, which is exposed by the protective film, from the carrier substrate; and
performing a second detaching process of detaching the base layer covered by the protective film from the carrier substrate after the first detaching process.

18. The method of claim 17, wherein the detaching process further comprises performing an intermediate detaching process of detaching the other portion of the dummy area, which is not detached from the carrier substrate before the second detaching process, from the carrier substrate after the first detaching process.

19. The method of claim 16, further comprising forming a sacrificial layer on the carrier substrate before the forming of the base layer on the carrier substrate.

20. The method of claim 16, further comprising detaching the protective film from the base layer, the circuit layer, the light emitting device layer, and the encapsulation layer before the removing of the dummy area.

* * * * *